357-30 SR
7/1/86 OR H 000,095

United States Statutory Invention Registration [19]

[11] Reg. Number: H95

Shanabrook et al. [45] Published: Jul. 1, 1986

[54] HETEROJUNCTION D⁻(OR A⁺) MILLIMETER AND SUBMILLIMETER WAVE DETECTOR

[75] Inventors: Benjamin V. Shanabrook, Alexandria, Va.; William J. Moore, Silver Spring, Md.

[73] Assignee: United States of America, Washington, D.C.

[21] Appl. No.: 802,286

[22] Filed: Nov. 27, 1985

[51] Int. Cl.[4] ..... H01L 31/00; H01L 45/00

[52] U.S. Cl. ..... 357/30; 357/2; 357/61

[56] References Cited

PUBLICATIONS

Publication, "Physics of Semiconductor Devices," S. M. Sze, A Wiley Inter-Science Publication, J. Wiley & Sons, 1981, pp. 126-129.

Publication, "Photoconductivity from Shallow Negative Donor Ions in Silicon: A New Far-Infrared Detector," Journal of Applied Physics, vol. 47, No. 1, Jan. 1976, P. Norton, pp. 308-320.

Publication, "Quantum States of Confined Carriers in Very Thin $Al_xGa_{1-x}As$—GaAs—$Al_xG_{1-x}$ As Heterostructures, R. Dingle et al. Physical Review Letters, 30 Sep. 74, vol. 33, No. 14, pp. 827-830.

*Primary Examiner*—Stephen C. Buczinski
*Assistant Examiner*—Linda J. Wallace
*Attorney, Agent, or Firm*—Robert F. Beers; William T. Ellis

[57] ABSTRACT

A solid state detector for use in detecting submillimeter and millimeter wave radiation. The solid state detector comprises a semiconductor superlattice of alternating thin epitaxial layers of GaAs and AlGaAs doped with impurities having the same conductivity type. Because of the transfer of charge carriers in order to obtain thermal equilibrium, the charge carriers in the higher energy doped layer transfer to the adjacent lower energy doped layer and form a predetermined number of either D⁻ or A⁺ centers in this layer. This D⁻ or A⁺ center formation is obtained without the use of an optical bias. The ionization energy for these D⁻ or A⁺ centers is small enough that photons from millimeter or submillimeter wave radiation is sufficient to ionize these carriers and yield a measurable conductivity in the device.

15 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HETEROJUNCTION D⁻(OR A⁺) MILLIMETER AND SUBMILLIMETER WAVE DETECTOR

BACKGROUND OF THE INVENTION

The present invention is directed generally to solid state radiation detectors, and more particularly to solid state detectors for the detection of submillimeter, millimeter, or infrared wave radiation.

There is increasing interest in the use of millimeter and submillimeter waves for military detection purposes. Wavelengths in the millimeter and submillimeter range have the advantage that they can penetrate smoke and clouds, while infrared waves cannot. Likewise, radiation in this wavelength region provides good spatial resolution, while requiring only a small antenna. These resolution and antenna features are in direct contrast to the requirements for microwave and radar wave devices. Additionally, all of the circuit components for millimeter and submillimeter wave devices are smaller than microwave and radar device components.

One of the major problems in fabricating a detector for millimeter and submillimeter waves is that the energy of the photon in these wavelengths is proportional to frequency. As the frequency of the radiation decreases from the infrared region to the submillimeter region to the millimeter region, the energy of the light photons decreases. For example, for the infrared wavelength of 10 microns, the energy per photon is 120 meV. Note that this infrared wavelength is in the 8–12 micron window. In contrast, for a wavelength of 1 millimeter (1000 microns), the energy per photon is 1.2 meV. This is a reduction in energy by two orders of magnitude from the energy of the infrared photon. Thus a material must be found with bound charges which can be excited by very small photon energies of on the order of 1.2 meV so that millimeter waves impinging on such a device would be sufficient to remove these bound charges to thereby increase the conductivity of the device. This change in conductivity could then be measured as an indication of the reception of the millimeter wave.

It is known that some doped semiconductors will form $D^-$ and $A^+$ centers under certain circumstances. In this regard, neutral impurity doping atoms can attract an additional charge carrier through the mechanism of sharing the impurity atoms's charge with this extra charge carrier. A $D^-$ center is formed when a neutral impurity donor added to a semiconductor binds not only the electron that it would normally bind, but also weakly binds a second electron thereto. In the case of the donor atom, this second extra electron is bound via the sharing of the positive charge at the atom's nucleus with the second electron. The energy binding this second electron to the neutral impurity donor is small enough that when a photon from a millimeter or submillimeter wave impinges on the $D^-$ center, this second weakly held electron is excited into the conduction band. Likewise, when a neutral acceptor impurity is added to a semiconductor, then the neutral acceptor atom will bind its own hole, and may also trap an extra hole very weakly. Accordingly, this $A^+$ center with its trapped extra hole has a positive charge. Again, the very small energy obtained from the photon of a submillimeter or millimeter wave will be sufficient to excite this second trapped hole into the conduction band for the material.

The basic problem for this type of device is that the number of steady state $D^-$ centers formed in a donor-doped semiconductor is very low. Likewise, the number of $A^+$ centers formed in an acceptor-doped semiconductor is also very low. In order to increase the $D^-$ centers or $A^+$ centers so that when a millimeter or submillimeter wave impinges on the material, a sufficient number of carriers will be excited into the material's conduction band so that a measurable response can be detected, an optical bias is required. Typically, the doped semiconductor device is flooded with an infrared optical bias beam. This infrared optical bias beam causes substantial photoconductivity, i.e., many electrons are excited into the material's conduction band. These ionized electrons then recombine with the various impurity centers in the semiconductors material. Statistically, a certain percentage of the carriers will combine weakly with neutral impurity atoms, resulting in charged impurity atoms. In the case of a donor impurity, a certain percentage of the excited electrons will combine weakly with the neutral donor impurity atom to form a $D^-$ center.

The optical bias required to establish an appreciable steady state of $D^-$ or $A^+$ centers results in a rather large, optically induced dark current in the device. This large dark current caused by the optical bias, in turn, causes shot noise in the device which limits the performance of the device to infrared detection applications. This shot noise is the statistical noise associated with the charge carriers moving from across one electrode to another in the device. The shot noise is proportional to the square root of the dark current resulting from the optical bias and effectively acts to prevent accurate detection of small conductivity changes in the device.

Accordingly, the problem confronting the art is how to minimize the dark current in the semiconductor device to thereby minimize the shot noise. In essence, the problem is to form the $D^-$ and $A^+$ centers without flooding the semiconductor material with optical bias light which causes the resulting dark current.

OBJECTS OF THE INVENTION

Accordingly, it is an object of the present invention to substantially eliminate shot noise in millimeter and submillimeter wave detectors.

It is a further object of the present invention to provide a millimeter or submillimeter wave detector using $D^-$ or $A^+$ centers without utilizing optical biasing.

Other objects, advantages, and novel features of the present invention will become apparent from the detailed description of the invention, which follows the summary.

SUMMARY OF THE INVENTION

Briefly, the present invention comprises a method and means for detecting millimeter, submillimeter and infrared waves, comprising the steps of disposing a specially designed semiconductor superlattice with a surface in a position to have millimeter, submillimeter, or infrared wave photons impinge on the superlattice surface, and then detecting the change in conductivity in the superlattice. The specially designed superlattice comprises alternating thin epitaxial layers of at least two different semiconductor materials, with the at least two different materials having different intrinsic bandgaps, with the bandgap difference therebetween being greater than KT, where K is the Boltzmann constant and T is the detector operating temperature. These at least two semiconductor materials are doped with neutral dopant molecules of the same conductivity type, such that some carriers resulting from the doping transfer from one of the doped thin epitaxial layers to an adjacent doped thin epitaxial layer and become weakly bound to neutral dopant molecules in the adjacent doped layer, i.e., $D^-$ or $A^+$ centers. An increase in the conductivity in the semiconductor superlattice results when millimeter, submillimeter or infrared wave photons impinge on the semiconductor superlattice and remove the weakly bound carriers from the $D^-$ or $A^+$ centers.

In a preferred embodiment, the semiconductor superlattice comprises a type I superlattice. This superlattice may be formed by alternating layers of GaAs and AlGaAs. These epitaxial layers should be in the range of 25–300 angstroms.

DETAILED DESCRIPTION OF THE PREFERRED EMBODIMENT

The present invention is based on the use of a specially designed semiconductor superlattice for radiation detection. It has been found that for superlattices comprising thin epitaxial layers of alternating materials with different intrinsic bandgaps (e.g. GaAs, AlGaAs, GaAs . . . ) thermal equilibrium is achieved by transferring, charge carriers (either electrons or holes) from one layer to an adjacent lower energy layer. This feature of the superlattice is utilized in order to form charged impurity centers. In essence, all of the alternating material layers are doped with the same conductivity type. In order to obtain thermal equilibrium, the charge carriers from a higher energy conduction band of one material layer transfer down to the lower energy conduction band of the adjacent layer. A significant percentage of these excess charge carriers are then weakly bound to the neutral doped impurity molecules to form the charged impurity centers. The ionization energy for these carriers bound to the neutral impurity molecules is very small and may be provided by photons from millimeter and submillimeter waves. Thus, the photoconductive response is obtained with this device in the millimeter and submillimeter radiation range without the requirement for a background optical bias.

Figure 1:
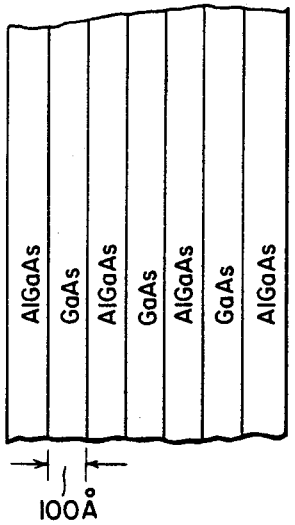
FIG. 1 is a schematic diagram of one embodiment of the present invention.

Referring now to FIG. 1, there is shown a standard semiconductor superlattice. The device is comprised of alternating thin epitaxial layers of at least two different semiconductor materials. Adjacent semiconductor layers of different materials should have different intrinsic bandgaps, with the intrinsic bandgap difference therebetween being greater than KT, where K is the Boltzmann constant, and T is the detector operating temperature. There are a variety of appropriate semiconductor materials which may be utilized for these alternating semiconductor material layers. Typically, these materials will be chosen so that they are reasonably well lattice matched, i.e., the spacing between the atoms is approximately the same with the same geometrical atomic arrangement. By way of example, but not by way of limitation, FIG. 1 illustrates the superlattice as being comprised of alternating layers of GaAs and AlGaAs. The composition of AlGaAs is $Al_xGa_{1-x}As$, where x may vary in the range $0 \leqq x \leqq 1$, with 0.3 being one preferred value for x. Each of these layers should be very thin. Typically the layer thickness will be in the range of 25–300 angstroms. For purposes of illustration only, the layers in FIG. 1 are shown as having a thickness of 100 angstroms.

Figure 2A:
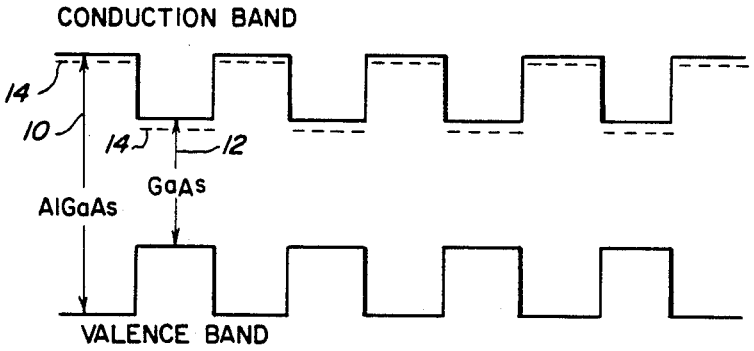
FIG. 2 is a schematic diagram of the band structure of a doped semiconductor superlattice at the instant of formation.
FIG. 2*b* is a schematic diagram of the band structure of one embodiment of the superlattice of the present invention.

Referring now to FIG. 2*a*, the band structure for a superlattice of alternating layers of AlGaAs and GaAs is shown. The bandgap for AlGaAs between its conduction band and its valence band is illustrated by the arrowed dimension 10. Likewise, the bandgap for GaAs between its conduction band and its valence band is illustrated by the arrowed dimension 12.

In accordance with the present invention, each of the layers of the superlattice is doped with an impurity of the same conductivity type. Typically, the doping is to a level of one part per $10^6$–$10^9$ molecules. If a $D^-$ center device is desired, then donor impurities such as, by way of example but not by way of limitation, Sn, Si, S, Se, Te, Ge, or other donors may be utilized. Likewise, if an $A^+$ center device is desired, then acceptor impurities such as C, Be, Mg, Zn, Si (if disposed properly in the material), Cd, Au, Mn, Ni, or other acceptors may be utilized. In FIG. 2*a*, doping with a donor impurity is illustrated in the figure. The small dashes 14 are included in the drawing to illustrate the added donor impurities in each layer with energies near the conduction bands for the different layers.

As noted previously, in order for the superlattice to obtain thermal equilibrium, various donor carriers must transfer from one doped layer to an adjacent doped layer in order to find an equilibrium distribution which is characteristic for the operating temperature of the device.

Figure 2B:
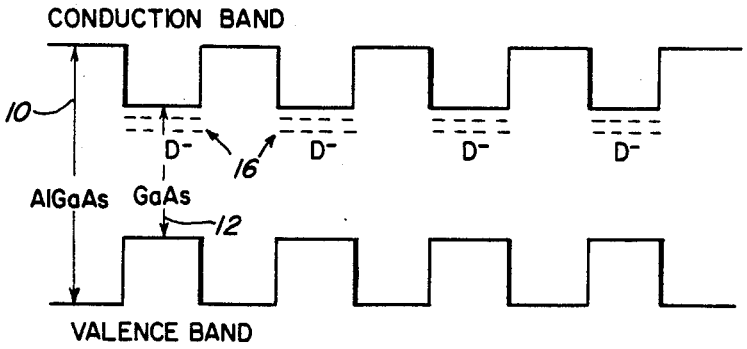

For the band structure shown in FIG. 1*a*, the electron donor carriers propagate or transfer from the higher energy conduction band of AlGaAs layer down to the the lower energy conduction band of the GaAs layer. These donor electrons now reside in the adjacent lower energy GaAs layer. A significant percentage of these excess electrons from the AlGaAs are then weakly bound to the neutral donor molecules in the GaAs to form $D^-$ centers. The location of these extra electrons in the conduction band of the lower energy GaAs layers is illustrated in FIG. 2*b* by the double set of dashed lines 16. Since these extra electrons are weakly bound to the donor molecules, the ionization energy of these bound electrons is rather small and may be provided by the photons from millimeter and submillimeter wave radiation. Accordingly, a photoconductive response is produced for millimeter and submillimeter wave radiation.

There are a variety of techniques which may be utilized in order to fabricate a doped superlattice of the type used in the present invention. One preferred technique of fabrication is to use molecular beam epitaxy. Using an MBE technique, a substrate such as GaAs, which is heated during growth, is located at the focal point of an 8-oven array located on a circle. Each oven emits a beam flux of its particular heated and vaporized element. The above defined oven configuration allows all of the beams from the ovens to impinge on the GaAs target at the same angle. High purity elemental charges such as As, Ga, Al, Be, and Si, are placed in the ovens for evaporation. The ovens may typically be Knudsen-type evaporation cells. The ovens operate at fixed, elevated temperatures (e.g., As at 350° C. Ga at 1070° C.), so that the flux densities of the beams impinging on the GaAs substrate can be controlled for the proper growth desired. Layered thicknesses are controlled and hyperabrupt interfaces are formed by precisely opening and closing a shutter disposed in front of the opening for each of the ovens. In operation, in order to form a doped AlGaAs layer, the shutters in front of the Al oven, the Ga oven, the As oven, and an impurity dopant oven are opened to permit four simultaneous beams to impinge on GaAs substrate target. By way of example, for an n-type dopant, the Si oven may be utilized. For a p-type dopant, the Be oven may be utilized. When the proper thickness of the doped AlGaAs layer is obtained, than all of the oven shutters are closed. Then the shutters for the Ga oven and As oven are opened along with an appropriate dopant oven shutter. These layers are then alternately grown on the substrate. This operation is typically performed in a supervacuum. The layer thicknesses are typically on the order of 25–300 angstroms. It should be noted that GaAs and AlGaAs are particularly well suited to each other because they have very close lattice matching which enables well-matched multilayer structures to be grown.

It should be noted that in an preferred embodiment the superlattice should be a type I superlattice. Type I superlattices utilize two or more different materials wherein the conduction band for each material is always higher in energy than all of the valence bands for the materials.

It should be noted that it is preferred that the present millimeter and submillimeter dectector device operate near absolute 0 temperature. The preferred temperature range is 0–4 degrees Kelvin, with a preferred temperature of 2 degrees Kelvin or less.

In essence, the present invention provides a new solid state detector for submillimeter or millimeter-wave detection. This device utilizes $D^-$ or $A^+$ center layers in a doped superlattice configuration. Such a configuration provides an appreciable concentration of $D^-$ or $A^+$ centers existing in thermal equilibrium without any background optical bias. Accordingly, the shot noise for the device is greatly reduced in this design. No other conduction processes are operating on the device when radiation is absent. Thus this device is an insulator unless millimeter or submillimeter wave radiation is impinged thereon.

It should be noted that the spectral distribution of the photoconductive response for the device can be varied by changing either the width of the material layers or the position of the $D^-$ or $A^+$ centers within the layers. The positioning of the $D^-$ or $A^+$ centers in the layers can be controlled simply by opening the donor or acceptor oven shutter at a predetermined time during the formation of the layer.

Obviously many modifications and variations of the present invention are possible in light of the above teachings. It is therefore to be understood that within the scope of the appended claims, the invention may be practiced otherwise than as specifically described.

What is claimed and desired to be secured by Letters Patent of the United States is:

1. A solid state detector for submillimeter and millimeter wave detection, which utilize no optical bias, comprising:

a semiconductor superlattice comprising alternating thin epitaxial layers of at least two different semiconductor materials, with said at least two different alternating materials having different bandgaps with the intrinsic bandgap difference therebetween being greater than KT, where K is the Boltzmann constant and T is the detector operating temperature, wherein said at least two semiconductor materials are doped with dopant molecules of the same conductivity type, such that some carriers resulting from said doping transfer from one of said doped thin epitaxial layers to an adjacent doped thin epitaxial layer and become weakly bound to a dopant molecule in said adjacent doped layer.

2. A detector as defined in claim 1, wherein said semiconductor superlattice is a Type I superlattice.

3. A detector as defined in claim 2 wherein said at least two different semiconductor materials are GaAs and AlGaAs.

4. A detector as defined in claim 3, wherein said dopant molecules are an n conductivity type.

5. A detector as defined in claim 3, wherein said dopant molecules are a p conductivity type.

6. A detector as defined in claim 2, wherein said thin epitaxial layers are in the range of 25–300 angstroms.

7. A method for detecting millimeter, submillimeter, and infrared waves, comprising the steps of:

disposing a semiconductor superlattice with a surface in a position to have millimeter, submillimeter, or infrared wave photons impinge on said superlattice surface, said superlattice comprising alternating thin epitaxial layers of at least two different semiconductor materials, with the at least two different materials having different intrinsic bandgaps, with the bandgap difference therebetween being greater than KT, where K is the Boltzmann constant and T is the detector operating temperature, wherein said at least two semiconductor materials are doped with neutral dopant molecules of the same conductivity type, such that some carriers resulting from said doping transfer from one of said doped thin epitaxial layers to an adjacent doped thin epitaxial layer and become weakly bound to a neutral dopant molecule in said adjacent doped layer; and detecting an increase in conductivity in said semiconductor superlattice when millimeter, submillimeter, or infrared wave photons impinge on said semiconductor superlattice and remove the weakly bound carries from said dopant molecules.

8. A method as defined in claim 7, wherein said superlattice disposing step comprises the step of disposing a Type I superlattice.

9. A method as defined in claim 8, wherein said superlattice disposing step comprises the step of disposing a superlattice with alternating layers of GaAs and AlGaAs with a layer thickness range of 25–300 angstroms.

10. A method for detecting millimeter, submillimeter, and infrared waves with no optical bias, comprising the steps of:

disposing a $D^-$ semiconductor superlattice with a surface and with no optical biasing or pre-biasing in a position to have millimeter, submillimeter, and infrared wave photons impinge on said superlattice surface, said superlattice comprising alternating thin epitaxial layers of two different semiconductor materials, with said two different semiconductor materials having different bandgaps, with the bandgap difference therebetween being greater then KT, where K is the Boltzmann constant and T is the detector operating temperature, wherein at vated temperatures (e.g., As at 350° C. Ga at 1070° C.), so that the flux densities of the beams impinging on the GaAs substrate can be controlled for the proper growth desired. Layered thicknesses are controlled and hyperabrupt interfaces are formed by precisely opening and closing a shutter disposed in front of the opening for each of the ovens. In operation, in order to form a doped AlGaAs layer, the shutters in front of the Al oven, the Ga oven, the As oven, and an impurity dopant oven are opened to permit four simultaneous beams to impinge on GaAs substrate target. By way of example, for an n-type dopant, the Si oven may be utilized. For a p-type dopant, the Be oven may be utilized. When the proper thickness of the doped AlGaAs layer is obtained, than all of the oven shutters are closed. Then the shutters for the Ga oven and As oven are opened along with an appropriate dopant oven shutter. These layers are then alternately grown on the substrate. This operation is typically performed in a supervacuum. The layer thicknesses are typically on the order of 25–300 angstroms. It should be noted that GaAs and AlGaAs are particularly well suited to each other because they have very close lattice matching which enables well-matched multilayer structures to be grown.

It should be noted that in an preferred embodiment the superlattice should be a type I superlattice. Type I superlattices utilize two or more different materials wherein the conduction band for each material is always higher in energy than all of the valence bands for the materials.

It should be noted that it is preferred that the present millimeter and submillimeter dectector device operate near absolute 0 temperature. The preferred temperature range is 0–4 degrees Kelvin, with a preferred temperature of 2 degrees Kelvin or less.

In essence, the present invention provides a new solid state detector for submillimeter or millimeter-wave detection. This device utilizes $D^-$ or $A^+$ center layers in a doped superlattice configuration. Such a configuration provides an appreciable concentration of $D^-$ or $A^+$ centers existing in thermal equilibrium without any background optical bias. Accordingly, the shot noise for the device is greatly reduced in this design. No other conduction processes are operating on the device when radiation is absent. Thus this device is an insulator unless millimeter or submillimeter wave radiation is impinged thereon.

It should be noted that the spectral distribution of the photoconductive response for the device can be varied by changing either the width of the material layers or the position of the $D^-$ or $A^+$ centers within the layers. The positioning of the $D^-$ or $A^+$ centers in the layers can be controlled simply by opening the donor or acceptor oven shutter at a predetermined time during the formation of the layer.

Obviously many modifications and variations of the present invention are possible in light of the above teachings. It is therefore to be understood that within the scope of the appended claims, the invention may be practiced otherwise than as specifically described.

What is claimed and desired to be secured by Letters Patent of the United States is:

1. A solid state detector for submillimeter and millimeter wave detection, which utilize no optical bias, comprising:

a semiconductor superlattice comprising alternating thin epitaxial layers of at least two different semiconductor materials, with said at least two different alternating materials having different bandgaps with the intrinsic bandgap difference therebetween being greater than KT, where K is the Boltzmann constant and T is the detector operating temperature, wherein said at least two semiconductor materials are doped with dopant molecules of the same conductivity type, such that some carriers resulting from said doping transfer from one of said doped thin epitaxial layers to an adjacent doped thin epitaxial layer and become weakly bound to a dopant molecule in said adjacent doped layer.

2. A detector as defined in claim 1, wherein said semiconductor superlattice is a Type I superlattice.

3. A detector as defined in claim 2 wherein said at least two different semiconductor materials are GaAs and AlGaAs.

4. A detector as defined in claim 3, wherein said dopant molecules are an n conductivity type.

5. A detector as defined in claim 3, wherein said dopant molecules are a p conductivity type.

6. A detector as defined in claim 2, wherein said thin epitaxial layers are in the range of 25–300 angstroms.

7. A method for detecting millimeter, submillimeter, and infrared waves, comprising the steps of:

disposing a semiconductor superlattice with a surface in a position to have millimeter, submillimeter, or infrared wave photons impinge on said superlattice surface, said superlattice comprising alternating thin epitaxial layers of at least two different semiconductor materials, with the at least two different materials having different intrinsic bandgaps, with the bandgap difference therebetween being greater than KT, where K is the Boltzmann constant and T is the detector operating temperature, wherein said at least two semiconductor materials are doped with neutral dopant molecules of the same conductivity type, such that some carriers resulting from said doping transfer from one of said doped thin epitaxial layers to an adjacent doped thin epitaxial layer and become weakly bound to a neutral dopant molecule in said adjacent doped layer; and detecting an increase in conductivity in said semiconductor superlattice when millimeter, submillimeter, or infrared wave photons impinge on said semiconductor superlattice and remove the weakly bound carries from said dopant molecules.

8. A method as defined in claim 7, wherein said superlattice disposing step comprises the step of disposing a Type I superlattice.

9. A method as defined in claim 8, wherein said superlattice disposing step comprises the step of disposing a superlattice with alternating layers of GaAs and AlGaAs with a layer thickness range of 25–300 angstroms.

10. A method for detecting millimeter, submillimeter, and infrared waves with no optical bias, comprising the steps of:

disposing a $D^-$ semiconductor superlattice with a surface and with no optical biasing or pre-biasing in a position to have millimeter, submillimeter, and infrared wave photons impinge on said superlattice surface, said superlattice comprising alternating thin epitaxial layers of two different semiconductor materials, with said two different semiconductor materials having different bandgaps, with the bandgap difference therebetween being greater then KT, where K is the Boltzmann constant and T is the detector operating temperature, wherein at